United States Patent
Yang et al.

(10) Patent No.: US 10,199,203 B2
(45) Date of Patent: Feb. 5, 2019

(54) COBALT, IRON, BORON, AND/OR NICKEL ALLOY-CONTAINING ARTICLES AND METHODS FOR MAKING SAME

(71) Applicant: Materion Corporation, Mayfield Heights, OH (US)

(72) Inventors: Xingbo Yang, Phoenix, AZ (US); Dejan Stojakovic, Danbury, CT (US); Matthew J. Komertz, New Fairfield, CT (US); Arthur V. Testanero, New Fairfield, CT (US)

(73) Assignee: MATERION CORPORATION, Mayfield Heights, OH (US)

( * ) Notice: Subject to any disclaimer, the term of this patent is extended or adjusted under 35 U.S.C. 154(b) by 232 days.

(21) Appl. No.: 15/154,683

(22) Filed: May 13, 2016

(65) Prior Publication Data
US 2016/0336155 A1     Nov. 17, 2016

Related U.S. Application Data

(60) Provisional application No. 62/161,424, filed on May 14, 2015, provisional application No. 62/321,622, filed on Apr. 12, 2016.

(51) Int. Cl.
  *H01J 37/34* (2006.01)
  *C23C 14/34* (2006.01)
  *C22C 19/07* (2006.01)

(52) U.S. Cl.
  CPC ...... *H01J 37/3426* (2013.01); *C23C 14/3414* (2013.01); *C22C 19/07* (2013.01); *H01J 2237/3322* (2013.01)

(58) Field of Classification Search
  CPC .................. H01J 37/3426; C23C 14/3414
  See application file for complete search history.

(56) References Cited

U.S. PATENT DOCUMENTS

| | | |
|---|---|---|
| 2007/0169853 A1 | 7/2007 | Kunkel et al. |
| 2010/0241316 A1 | 9/2010 | Uehira |
| 2012/0241316 A1 | 9/2012 | Arakawa |

FOREIGN PATENT DOCUMENTS

| | | |
|---|---|---|
| CN | 1790566 A | 6/2006 |
| JP | H01-104767 A | 4/1989 |

OTHER PUBLICATIONS

International Search Report and Written Opinion for International Application No. PCT/US2016/032499 dated Aug. 9, 2016.
Singapore Search Report for Singapore Application No. 11201700667V dated Oct. 2, 2017.

*Primary Examiner* — Jessee R Roe
(74) *Attorney, Agent, or Firm* — Fay Sharpe LLP

(57) ABSTRACT

Methods for making a high purity (>99.99%) and low oxygen (<40 ppm) sputtering target containing Co, CoFe, CoNi, CoMn, CoFeX (X=B, C, Al), Fe, FeNi, or Ni alloys with a column microstructure framed by boron intermetallics are disclosed. The sputtering target is made by directional casting a molten mixture of the metal alloy, annealing to remove residual stresses, slicing, and optional annealing and finishing to obtain the sputtering target.

17 Claims, 4 Drawing Sheets

COBALT, IRON, BORON, AND/OR NICKEL ALLOY-CONTAINING ARTICLES AND METHODS FOR MAKING SAME

CROSS-REFERENCE TO RELATED APPLICATIONS

This application claims priority to U.S. Provisional Patent Application Ser. No. 62/161,424, filed on May 14, 2015, and to U.S. Provisional Patent Application Ser. No. 62/321,622, filed on Apr. 12, 2016. The disclosures of these applications are hereby fully incorporated by reference in their entirety.

BACKGROUND

The present disclosure relates to a method for making articles, such as sputtering targets, containing Co, CoFe, CoNi, CoMn, CoFeX (X=B, C, Al), Fe, FeNi, and Ni. The articles may exhibit enhanced magnetic pass-through-flux (PTF) and low particulation during sputtering to shorten burn-in time for optimum operation. In some embodiments, preferably the sputtering targets exhibit a boron (B) content of greater than 15 at %, including 20 at % or more.

The marketplace for random access memory (RAM) is rapidly changing. Today, many electronic devices rely on magnetoresistive RAM (MRAM), based on field switching, as embedded memory. MRAM and spin-transfer torque RAM (STTRAM) will continue to replace static RAM (SRAM) and dynamic RAM (DRAM) in many electronic devices.

The core magnetic films forming magnetic tunnel junctions in MRAM and STTRAM are made of cobalt-iron-boron (CoFeB) alloys with high boron content. However, CoFeB alloys are extremely brittle and difficult to cast without cracking. High boron content CoFeB alloys are typically produced via sintering from powders, which makes it difficult to maintain low oxide/impurities levels and also high pass through flux (PTF).

It would be desirable to develop methods for casting crack-free alloy articles (e.g., sputtering targets) with high PTF, high purity, and low particulation at lower costs, amongst other characteristics.

BRIEF DESCRIPTION

The present disclosure relates to methods for casting alloys, such as cobalt-iron-boron alloys with >4N purity and low oxygen below 40 ppm. Also included are the alloys so formed as well as the alloys to produce related articles, such as sputtering targets. Preferably, in some embodiments, the sputtering targets have a boron content of greater than 15 at %, including greater 20 at % or more.

More particularly, disclosed are methods for making an alloy sputtering target, comprising: forming a molten alloy mixture; pouring the molten alloy mixture into a mold (such as by means of a funnel) to form a casting; annealing (e.g., vacuum annealing, post-vacuum annealing, or annealing with gas protection) the casting to form a casting ingot; and slicing the casting ingot to form the alloy sputtering target.

In other embodiments, the molten alloy mixture can be formed from a composition including at least one of cobalt (Co), iron (Fe), boron (B), and/or nickel (Ni) as a primary constituent, or a composition including cobalt (Co) and at least one additional element including iron (Fe), nickel (Ni), or manganese (Mn).

In some particular embodiments, the molten alloy mixture is formed from a composition including 15 at % or more of boron (B), including 20 at % or more, 25 at % or more, and 30 at % or more.

In some additional embodiments, the molten alloy mixture is formed from a composition having the general formula of CoFeX, where X is one of boron (B), carbon (C), and/or aluminum (Al).

In other particular embodiments, the molten alloy mixture is formed from a mixture of cobalt (Co), iron (Fe), and boron (B) with a column structure framed by CoFeB intermetallics.

In further embodiments, the molten alloy mixture is formed from a composition including iron (Fe) and nickel (Ni).

In some embodiments, the casting can be shaped prior to slicing the casting ingot.

In still other embodiments, the sputtering target may be annealed a second time after slicing the casting ingot.

The sputtering target may also be finished, for example by grinding a surface, after slicing the casting ingot.

The molten mixture can be formed by induction melting the alloy in a crucible.

The annealing may be performed at a temperature of less than 700° C. Annealing may be performed under vacuum or with inert gas protection.

The mold may be located on a vibration table or on a water chill plate.

The funnel may comprise a conical top portion and a cylindrical bottom portion, the cylindrical bottom portion having a plurality of exit holes.

The resulting sputtering target may comprise an alloy selected from the group consisting of $CoFeB_{20}$, $CoFeB_{20}$, and $FeCoB_{20}$, where the numbers refer to the atomic percentage of each element. The boron content of the alloy can be up to 33 at %.

More generally, the sputtering target may comprise an alloy of the formula $Co_xFe_yB_{(1-x-y)}$. Here, the numbers refer to the atomic fraction of each element. The values for x and y can independently be from 0.05 to 0.75. In some embodiments, x=y.

The resulting sputtering target may alternatively comprise an alloy selected from the group consisting of Co, CoFe, CoNi, and CoMn.

In some other embodiments, the sputtering target may comprise an alloy of the general formula CoFeX, where X is one of B, C, and/or Al.

In further embodiments, the sputtering target may comprise an alloy selected from the group consisting of Fe, FeNi, and Ni.

The sputtering target may have a diameter of up to 250 mm; including from 25 mm to 250 mm or more. The sputtering target may have a pass through flux (PTF) of at least 30% at a thickness of 3 mm.

The sputtering target may also have a total purity above 99.99%. More particularly, the sputtering target may have oxygen content less than 40 ppm.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
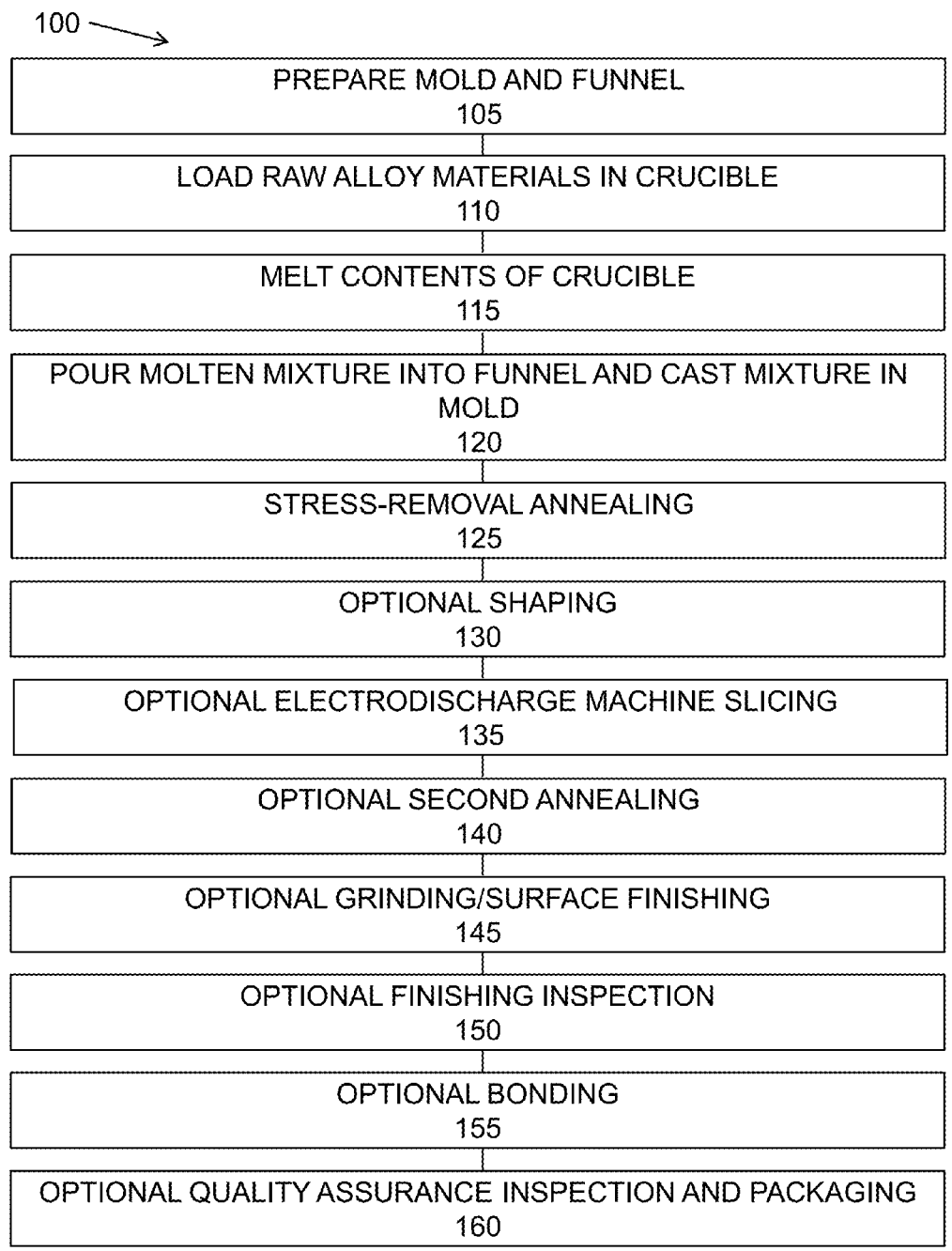
FIG. 1 is a flow chart illustrating an exemplary method of the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named components/steps and permit the presence of other components/steps. However, such description should be construed as also describing compositions or processes as "consisting of" and "consisting essentially of" the enumerated components/steps, which allows the presence of only the named components/steps, along with any impurities that might result therefrom, and excludes other components/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 to 10" is inclusive of the endpoints, 2 and 10, and all the intermediate values).

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

This disclosure will refer to temperatures for heating various materials. Those temperatures refer to the temperature to which the chamber is heated, e.g. the air in the chamber. The material to be heated itself may not reach these particular temperatures, but does attain a higher temperature after the heating is performed.

The present disclosure relates to methods for making articles from alloys having a composition including at least one of cobalt (Co), iron (Fe), boron (B), and/or nickel (Ni) as a primary constituent. These can be cast to form crack-free and high purity (4N) alloy sputtering targets that have high magnetic pass through flux and high purity.

A method for making a sputtering target according to embodiments of the present disclosure very generally includes making an ingot via directional casting from a melt. Next, the ingot is shaped/machined into the sputtering target.

Making the casting ingot according to embodiments of the present disclosure very generally includes first providing a molten alloy. Raw materials of the various elements are homogenously melted, usually by induction melting in vacuum. Slow heating may be utilized for degassing purposes. The heating rate can be controlled by time and power/mass. Temperature fluctuation at the holding temperature must be minimized by tight process control. The induction melting may be performed under a vacuum. The molten alloy is subsequently poured into a mold to obtain the directional casting. Directional growth casting designs should be used. It is particularly contemplated that the alloy is cast in a vacuum, to reduce the oxygen content of the resulting casting and minimize material loss caused by formation of slag. Temperature fluctuations may be controlled by a control system during the pouring and/or casting. Pouring may be controlled to avoid turbulence and bi-filming. The casting may be annealed to remove casting stress, which can be performed under vacuum or under inert gas protection. The ingot is thus obtained.

FIG. 1 illustrates an exemplary embodiment of a method 100 of the present disclosure. The method 100 includes preparing a mold and funnel 105; loading raw alloy materials in a crucible 110; melting raw material in the crucible 115; pouring a molten mixture of the alloy from the crucible into the funnel and casting the mixture in the mold 120 to obtain a casting ingot; stress-removal annealing the casting ingot 125; optional shaping of the casting ingot 130; slicing the casting ingot 135 to obtain the sputtering target; optional secondary annealing 140; optional surface finishing (e.g., grinding, polishing) 145; optional finishing inspection 150; optional bonding 155; and optional quality assurance inspection and packaging 160.

In some embodiments, the mold is placed on a vibration table or a water cooling plate. The vibration table may be vibrating vertically and/or horizontally at a frequency of from about 20 Hz to about 80 Hz. The water cooling plate may be the bottom plate of the mold and be cooled by running water.

The raw alloying materials are loaded into the crucible 110. In some embodiments where boron is included in the alloy, contact between the boron and the crucible surface is avoided to prevent the boron from undesirably reacting with the crucible.

In some embodiments, the alloying materials are refined and degassed. The refining and degassing may be performed via a master alloy process.

The crucible such as alumina, zirconia is generally used. In some embodiments, the crucible is configured to melt from about 30 kg to about 100 kg of the alloy.

In some embodiments, the contents of the crucible are induction melted 115. Induction melting utilizes high-frequency magnetic fields to liquefy the alloy materials in the crucible and then stir the melted materials to reach ideal homogeneity. Slow heating may be utilized for degassing purposes. The heating rate can be controlled by time and power/mass. The induction melting may be performed under a vacuum. The heating rate may be less than about 600° C. per hour.

In other embodiments, the contents of the crucible are melted by one of a number of other sources including resistive, conductive, and/or electron beam elements. Electron beam melting utilizes streams of electrons to liquefy alloy materials as they are fed into the beam. Impurities evaporate off and molten alloy collects in a pool that will solidify into an ingot.

The resulting alloy may have multiple phases (α-Co, γ-Fe) and intermetallic structures composed of (Fe, Co)$_2$B phase and (Fe, Co)$_3$B phase. Multi-phase (α-Co, γ-Fe) may have a face centered cubic structure (FCC or cF4). The intermetallic compounds frame the column microstructure, which is favorable for better sputtering performance.

The resulting alloy may have the formula $Co_xFe_yB_{(1-x-y)}$, where x and y represent the atomic percentage of cobalt and boron, respectively (sum=1). The values for x and y can independently be from 0.05 to 0.75.

In some embodiments, the resulting alloy may be selected from the group consisting of cobalt (Co), CoFe, CoNi, and CoMn.

In other embodiments, the resulting alloy may be selected from the group consisting of iron (Fe), nickel (Ni), and FeNi.

In further embodiments, the resulting alloy may comprise an alloy of the general formula CoFeX, where X is one of boron (B), carbon (C), and/or aluminum (Al).

In some further embodiments, the resulting alloy may comprise an alloy including 15 at % or more of boron (B), including 20 at % or more, 25 at % or more, and 30 at % or more.

An exemplary funnel that can be used in the systems and methods of the present disclosure includes a rectangular prism top portion and a cylindrical bottom portion. The bottom portion includes a plurality of exit holes.

Figure 2:
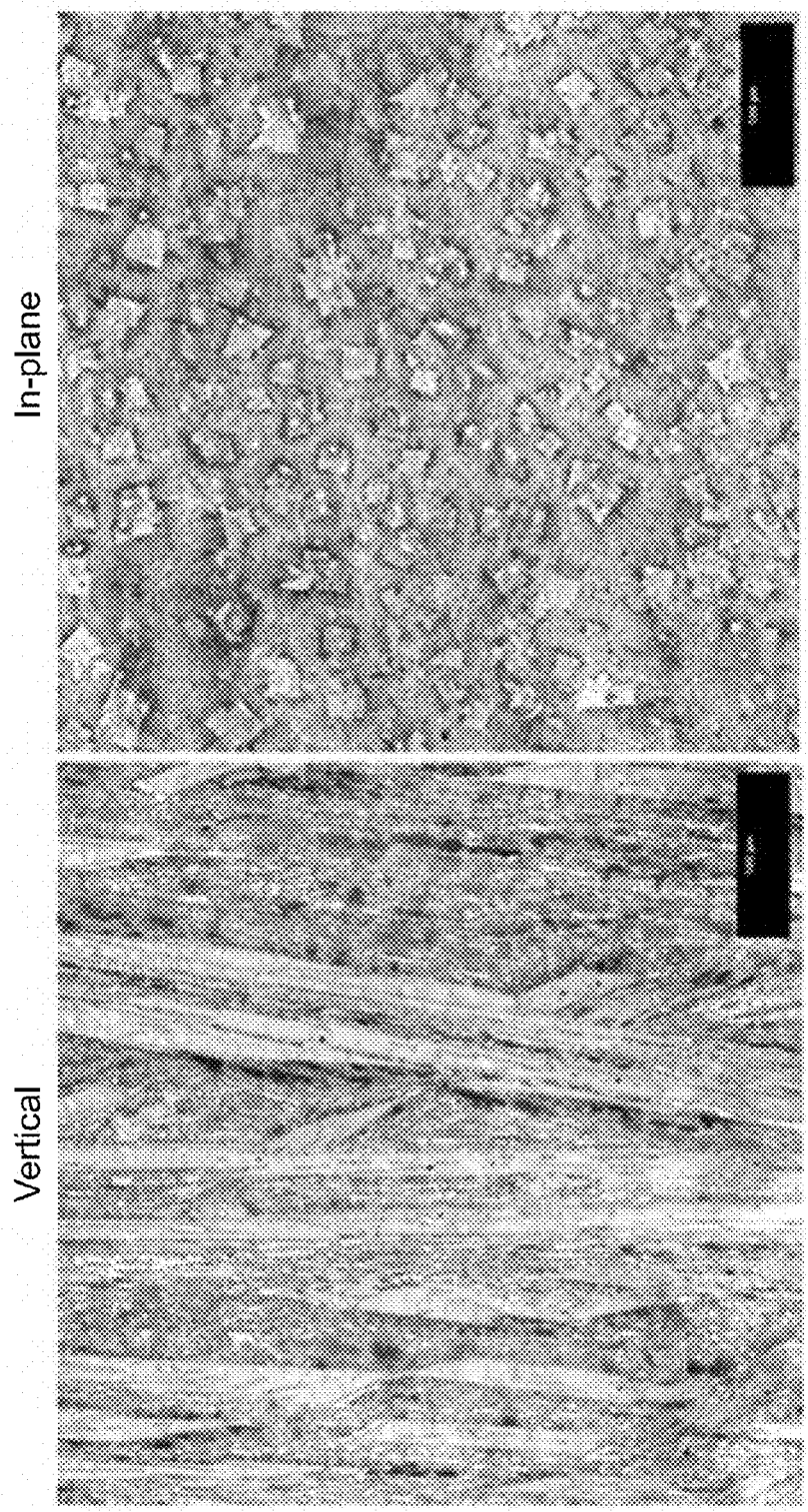
FIG. 2 is a photo-micrograph of two castings illustrating directional crystal growth versus in-plane crystal growth.

The pouring/casting permits directional crystal growth during solidification. With reference to FIG. 2, two castings made from the exemplary alloys disclosed herein are shown. The left side of FIG. 2 shows a casting having directional crystal growth with a column microstructure, and the right side of FIG. 2 shows a casting having in-plane crystal growth. The in-plane casting has a crystalline structure with random orientation of grains, whereas the grains in the directional casting are oriented vertically. This directional orientation is due to the exemplary pouring/casting, which causes the intermetallics in the molten metal to precipitate first along the ingot thickness direction. In some embodiments, the directional crystal growth is perpendicular to the target plate, which may provide advantages such as high PTF and uniform sputtering films. The system may be under a vacuum during the pouring and/or casting. Temperature fluctuations may be controlled by a control system during the pouring and/or casting. Higher overheat is preferred when the mold has a large cross-sectional area. In some embodiments, the pouring temperature or overheat is from about 40° C. to about 140° C. In other words, the molten metal is poured at a temperature of about 40° C. to about 140° C. above the melting point of the alloy. Pouring 120 may be controlled to avoid turbulence and bi-filming.

Next, the casting ingot is annealed 125 to remove residual stresses. The annealing may be at a temperature below 700° C. with a cooling/heating rate of under 100° C. per hour, and is applied for a minimum of 8 hours. The annealing 125 removes stress from the casting step and subsequent cooling, and does not cause any changes to the microstructure of the casting. In some embodiments, the casting ingot is annealed with inert gas protection.

The annealed casting ingot can be shaped 130 prior to slicing. Shaping 130 can include grinding the bottom to a mirror surface, grinding the top to make the surface flat and parallel to the bottom surface, resizing the casting by water jetting or electro-discharge machining (EDM) (e.g., to form a rectangular tile sputtering target), and/or grinding or milling the cross-sections.

Next, the casting ingot is sliced 135 to obtain the sputtering target. In particular embodiments, EDM slicing or wire saw cutting is used. In this manner, multiple sputtering targets can be obtained from a single casting ingot. The sputtering target may have any desired shape, for example circular or rectangular. The sputtering target may have a diameter of up to 250 mm, and can be scaled for larger sizes as well.

Optionally, the sputtering target can be annealed again 140, i.e. annealed a second time. The second annealing 140 may be performed using the same or different values for the process parameters (e.g., time, temperature, and pressure).

The casting may undergo grinding, polishing, or other surface finishing 145 to achieve final dimensions and/or a desired surface roughness. Surface finishing may include blasting with beads to remove any manufacturing defects from the surface. Following bead blasting, a series of cleaning processes such as dust blowing-off, surface wiping, dry ice blasting, and moisture removal can be carried out to remove any blasting-induced dirt, impurities. This process results in a finished article, such as a sputtering target, that has homogeneous surface structure, is contamination-free, is free of residual stresses, and reduces particulation during subsequent sputtering processes. Particulation refers to how many particles of differing sizes remain on the finished article which has been deposited onto a substrate such as a wafer. In some embodiments, there are about 100 particles or less in the 0.1 μm to 1 μm size range on the surface. In other embodiments, there are about 30 particles or less having a size of about 60 nm on the surface. In some embodiments, there are about 5 particles or less having a size of about 60 nm on the surface. In other embodiments there are about 5 particles or less having a size of less than 60 nm on the surface. In some embodiments, no particles having a size larger than 200 nm were detected.

The finished article may undergo a finishing inspection 150.

The article may be bonded 155. In some embodiments, the article is a sputtering target and is bonded to a backing plate to form a sputtering target assembly.

The sputtering target assembly may be subject to a final quality assurance inspection and packaging.

Non-limiting examples of CoFeB alloys include CoFeB$_{20}$, CoFeB$_{25}$, and FeCoB$_{30}$. The CoFeB alloy may be at least 99.99% pure.

Non-limiting examples of other Co based alloys include CoFe, CoNi, CoMn, and CoFeX, where X is at least one of B, C, or Al. Non-limiting examples of other Fe based alloys include FeNi. In some embodiments, the maximum levels of various impurities are recited in the following Table:

| Element | Maximum (ppm) |
| --- | --- |
| Silver (Ag) | 0.01 |
| Aluminum (Al) | 3 |
| Gold (Au) | ND |

-continued

| Element | Maximum (ppm) |
|---|---|
| Carbon (C) | 200 |
| Calcium (Ca) | 0.03 |
| Chlorine (Cl) | 0.03 |
| Chromium (Cr) | 5 |
| Copper (Cu) | 0.7 |
| Lithium (Li) | 0.01 |
| Magnesium (Mg) | 0.1 |
| Manganese (Mn) | 10 |
| Nitrogen (N) | 1 |
| Sodium (Na) | 0.01 |
| Oxygen (O) | 40 |
| Lead (Pb) | 0.04 |
| Sulfur (S) | 2.5 |
| Silicon (Si) | 20 |
| Samarium (Sm) | 0.001 |
| Tin (Sn) | 0.00 |
| Thorium (Th) | 0.001 |
| Titanium (Ti) | 0.4 |
| Uranium (U) | 0.001 |
| Vanadium (V) | 0.01 |
| Zinc (Zn) | 0.03 |
| Zirconium (Zr) | 0.4 |

It should be understood that in some embodiments the alloy articles disclosed herein may include aluminum (Al) and/or manganese (Mn) as alloying elements, as listed in the Table above, However, in some other embodiments the alloy articles disclosed herein may include aluminum (Al) and/or manganese (Mn) as alloying elements. In such embodiments, aluminum (Al) and/or manganese (Mn) may be included as alloying elements in the range of about 2 at % to about 4 at %.

The cast article may have a multi-phase ($\alpha$-Co, $\gamma$-Fe) column microstructure for enhanced magnetic pass through flux (PTF). In some embodiments, the PTF is at least 30% at a thickness of 3 mm. The density of the cast article may be 100%.

Figure 3:
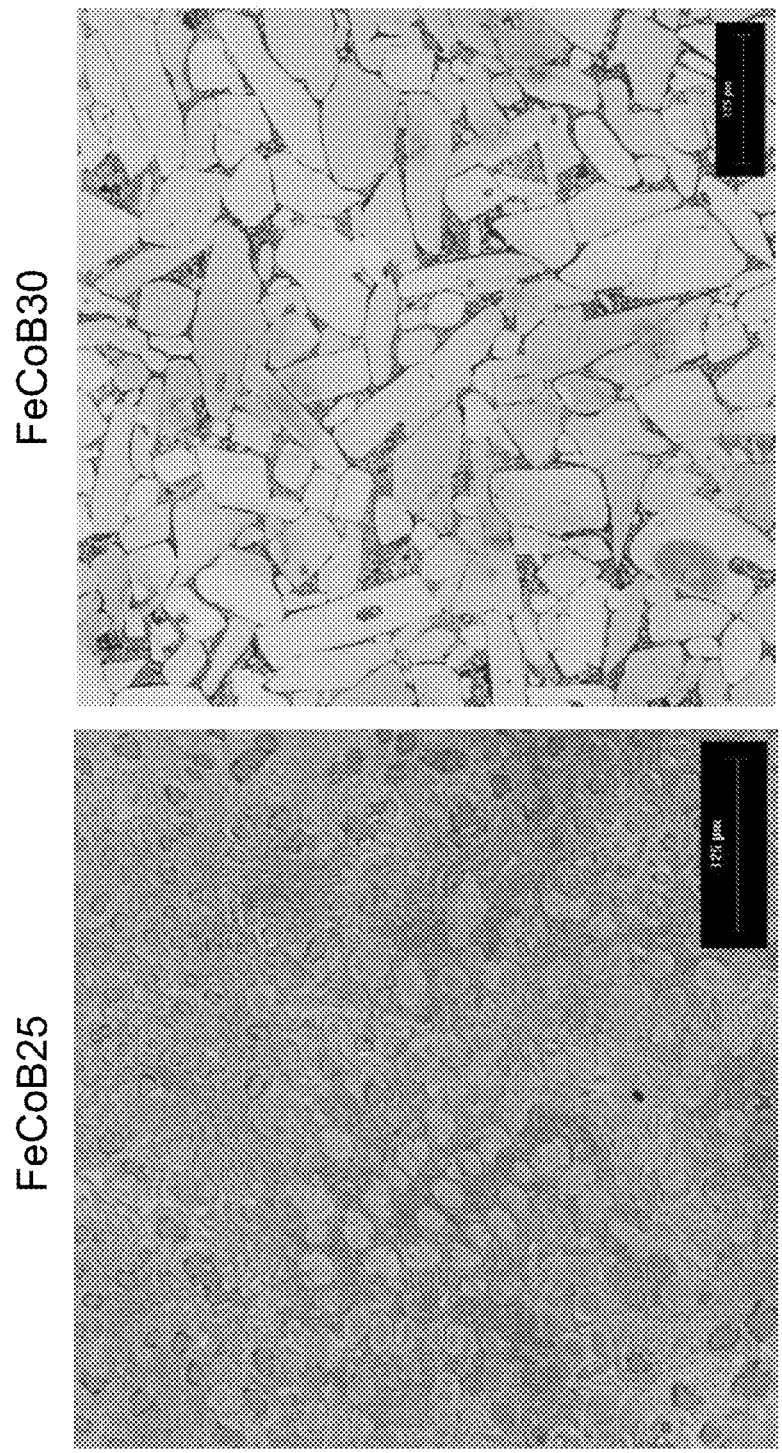
FIG. 3 is a photo-micrograph of two castings illustrating the uniform microstructure of sputtering targets made according to exemplary methods of the present disclosure.

The microstructure of the cast article is uniform. With reference to FIG. 3, two cast articles made from the exemplary alloys disclosed herein are shown. The left side of FIG. 3 shows a $FeCoB_{25}$ alloy and the right side of FIG. 3 shows a $FeCoB_{30}$ alloy. The alloys pictured in FIG. 3 show a uniform dispersal of borides bound by (Fe, Co) phase having a generally columnar shape.

The cast article may have a crystal unit cell structure described as face centered cubic (FCC or cF4). Cast articles having an FCC structure are more ductile.

The cast articles may have a thickness in the range of from about 2 mm to about 10 mm, including from about 3 mm to about 8 mm.

In some embodiments, the cast articles are cylindrical. The cylinder may have a diameter in the range of from about 125 mm to about 250 mm, including from about 200 mm to about 250 mm.

The methods of the present disclosure enable the production of high purity alloy articles by low-cost casting and without the cracking associated with expensive hot isotactic pressing. The methods also enable directional crystal growth (e.g., for sputtering targets), near-shape manufacturing, high uniformity in composition and density (e.g., 100% density), low oxygen content (e.g., at most 40 ppm) and low impurities, and enhanced PTF (e.g., over 30%).

The methods of the present disclosure are suitable for producing sputtering targets. Sputter deposition is used, for example, in the manufacture of micro-electronics, the coating of glass and other substrates, and in other industrial processes where the deposition of a particular material in a controlled manner is desired. Sputtering is often accomplished by use of an ion beam, plasma beam, or other energetic beam of particles which are directed at a sputtering target in a controlled environment. Material is eroded from the sputtering target and deposited upon a substrate. The composition of the target typically determines the composition of the film being deposited on the substrate.

Sputtering targets made by the methods of the present disclosure are suitable for manufacturing random access memory (RAM) devices. In some particular embodiments, the sputtering target formed by the method of the present disclosure are used to make magnetoresistive RAM (MRAM), including spin-transfer torque RAM (STTRAM) for use in many electronic devices.

MRAM devices utilize magnetic tunnel junctions (MTJs) which generally consist of an insulating layer—the tunnel junction—sandwiched between two or more ferromagnetic layers. The ferromagnetic layers can be made from the alloys disclosed herein, such as cobalt-iron-boron (CoFeB), for example. In some embodiments, the insulating layer for the MTJ is made from crystalline magnesium-oxide (MgO), which exhibits an excellent tunneling magnetoresistance effect (TMR). In some other embodiments, the insulating layer for the MTJ is made from magnesium by reactive sputtering. At least one top cap layer can be included. In some embodiments, the at least one top cap layer is made from tantalum (Ta), for example. In other embodiments, the at least one top cap layer is made from molybdenum (Mo). In some other embodiments, the at least one top cap layer is made from tungsten (W). An inter-layer of ruthenium (Ru) can be adjacent one of the ferromagnetic layers. Finally, an antiferromagnet (AFM) is included, which is typically made from an alloy of FeMn, MnNi, MnPt, MnIr, MnPdPt, and/or artificial antiferromagnetic coupling (super-lattice), for example. Sputtering can be used to deposit the various layers comprising the MRAM/STTRAM in the form of a thin film onto a substrate (e.g., a semiconductor wafer). The layers are located between a top and bottom electrode. Non-volatile memory devices such as STTRAM are formed directly onto a complementary metal-oxide semiconductor (CMOS) wafer.

Example

Figure 4:
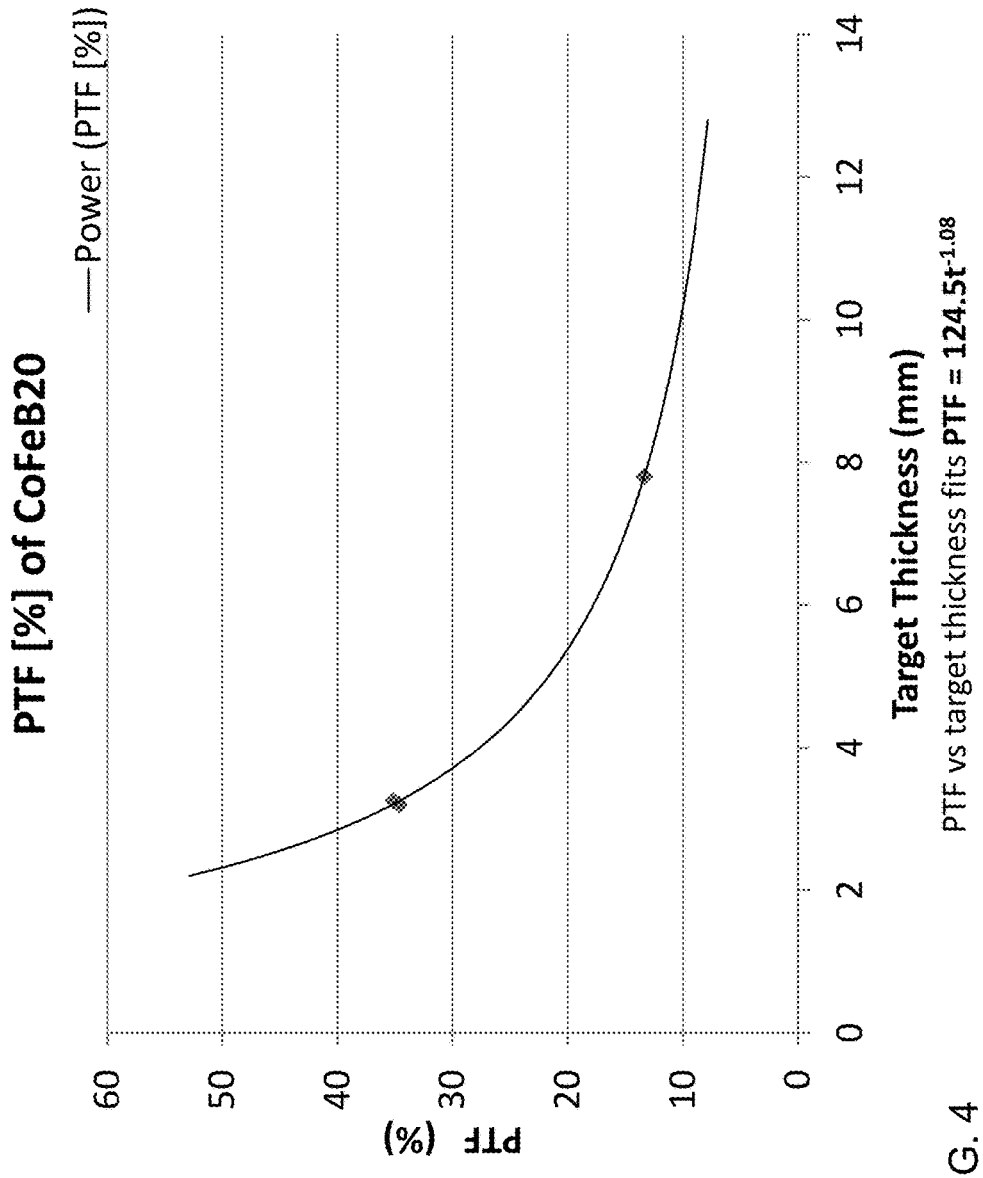
FIG. 4 is a graph showing magnetic pass-through flux (PTF) versus target thickness for sputtering targets made according to exemplary methods of the present disclosure.

Sputtering targets made from a $CoFeB_{20}$ alloy were produced according to the exemplary methods disclosed herein. The sputtering targets had varying thicknesses of about 2 mm to about 13 mm. The $CoFeB_{20}$ targets were deposited via sputtering to a large size wafer. For sputtering targets having a thickness between about 2 mm and 13 mm, a corresponding magnetic pass-through flux (PTF) of about 50% to about 5% was measured. At a thickness of about 3 mm, the sputtering target had a PTF of about 35%. At a thickness of about 8 mm, the sputtering target had a PTF of about 15%. The measured PTF versus target thickness is shown in the graph of FIG. 4.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:
1. A method for making a sputtering target, comprising:

forming a molten alloy mixture, wherein the molten alloy mixture comprises (i) a composition including at least one of Co, Fe, or B, as a primary constituent, or (ii) a composition including Co and at least one of Fe, and Ni, or (iii) a composition of the formula CoFeX, wherein X is one of B, C, or Al;

pouring the molten mixture into a mold to form a directional casting ingot;

annealing the casting ingot; and slicing the casting ingot to form the sputtering target, wherein the sputtering target has a purity of greater than 99.99% and a low oxygen content of 40 ppm or less, and has a column microstructure framed by borides.

2. The method of claim 1, wherein the molten alloy mixture comprises a composition including 15% or more of boron (B).

3. The method of claim 1, further comprising (i) shaping the casting ingot prior to slicing the casting ingot, or (ii) annealing the sputtering target after slicing the casting ingot, or (iii) finishing the sputtering target after slicing the casting ingot.

4. The method of claim 3, wherein the finishing comprises grinding at least one surface of the sputtering target.

5. The method of claim 1, wherein the annealing is performed at a temperature of less than 700° C. for a minimum of about 8 hours.

6. The method of claim 1, further comprising pouring the molten mixture into a funnel above the mold, wherein the funnel comprises a conical top portion and a cylindrical bottom portion.

7. The method of claim 1, wherein the sputtering target comprises an alloy of the formula $Co_xFe_yB_{(1-x-y)}$.

8. The method of claim 1, wherein the sputtering target comprises an alloy of the formula $(CoFe)_{1-x}B_x$, wherein $0.2 \leq x \leq 0.4$.

9. The method of claim 1, wherein the sputtering target has a diameter of up to 250 mm.

10. The method of claim 1, wherein the sputtering target has a pass through flux of at least 30% at a thickness of 3 mm.

11. The method of claim 1, wherein the sputtering target has a purity of 99.99%.

12. The method of claim 1, wherein the sputtering target has an oxygen content less than 40 ppm.

13. The method of claim 1, wherein the sputtering target has a B content of greater than 15%.

14. The method of claim 1, wherein the annealing is performed under vacuum or under gas protection using an inert gas.

15. The method of claim 1, wherein the sputtering target has a uniform microstructure.

16. A sputtering target for production of a magnetoresistive RAM (MRAM) prepared by a process comprising the steps of:

forming a molten alloy mixture comprising Co, Fe, B, or Ni and at least one of Ni, Mn, B, C, and/or Al;

pouring the molten mixture into a funnel located above a mold to form a directional casting ingot;

annealing the casting ingot; and

EDM slicing the casting ingot to form the sputtering target, wherein the sputtering target has a purity of greater than 99.99%, and has a column microstructure framed by borides.

17. The sputtering target formed by the process of claim 16, wherein the sputtering target has a B content of greater than 15%.

* * * * *